United States Patent
Chen et al.

(10) Patent No.: US 10,353,262 B2
(45) Date of Patent: Jul. 16, 2019

(54) METHOD FOR FABRICATING ELECTROCHROMIC DEVICE

(71) Applicant: INSTITUTE OF NUCLEAR ENERGY RESEARCH, ATOMIC ENERGY COUNCIL, EXECUTIVE YUAN, R.O.C., Taoyuan (TW)

(72) Inventors: Po-Wen Chen, Taoyuan (TW); Chen-Te Chang, Taoyuan (TW); Peng Yang, Taoyuan (TW); Jin-Yu Wu, Taoyuan (TW); Der-Jun Jan, Taoyuan (TW); Cheng-Chang Hsieh, Taoyuan (TW); Wen-Fa Tsai, Taoyuan (TW); Min-Chuan Wang, Taoyuan (TW)

(73) Assignee: Institute of Nuclear Energy Research, Atomic Energy Council, Executive Yuan, R.O.C, Taoyuan (TW)

( * ) Notice: Subject to any disclaimer, the term of this patent is extended or adjusted under 35 U.S.C. 154(b) by 172 days.

(21) Appl. No.: 15/670,149

(22) Filed: Aug. 7, 2017

(65) Prior Publication Data
US 2018/0120662 A1 May 3, 2018

(30) Foreign Application Priority Data
Oct. 28, 2016 (TW) .............................. 105134990 A

(51) Int. Cl.
| | |
|---|---|
| *C23C 14/32* | (2006.01) |
| *G02F 1/155* | (2006.01) |
| *C23C 14/08* | (2006.01) |
| *G02F 1/1343* | (2006.01) |
| *H01J 37/32* | (2006.01) |

(52) U.S. Cl.
CPC ............ *G02F 1/155* (2013.01); *C23C 14/083* (2013.01); *C23C 14/085* (2013.01); *C23C 14/086* (2013.01); *C23C 14/325* (2013.01); *G02F 1/13439* (2013.01); *H01J 37/32055* (2013.01); *H01J 2237/332* (2013.01)

(58) Field of Classification Search
CPC ... C23C 14/083; C23C 14/085; C23C 14/086; C23C 14/325; H01J 37/32055; H01J 2237/332; G02F 1/13439; G02F 1/155
USPC ........................................ 204/192.38, 298.41
See application file for complete search history.

(56) References Cited

PUBLICATIONS

Devan et al. "Electrochromic properties of large are and high density arrays of transparent one-dimensional β-Ta2O5 nanorods on indium-tin-oxide thin films" Applied Physics Letters 98, 133117, 2011 (Year: 2011).*

(Continued)

*Primary Examiner* — Rodney G McDonald
(74) *Attorney, Agent, or Firm* — Rosenberg, Klein & Lee

(57) ABSTRACT

The present invention discloses a method for fabricating an electrochromic device, which adopts the vacuum cathodic arc-plasma deposition to comprise five layers with an ionic conduction layer (electrolyte) in contact with an electrochromic (EC) layer and an ion storage (complementary) layer, all sandwiched between two transparent conducting layers sequentially on a substrate. The method owns superior deposition efficiency and the fabricated thin film structures have higher crystalline homogeneity. In addition, thanks to the nanometer pores in the thin film structures, the electric capacity as well as the ion mobility are greater. Consequently, the reaction efficiency for bleaching or coloring is enhanced.

10 Claims, 2 Drawing Sheets

(56) References Cited

PUBLICATIONS

Wang et al. "The improvement of all-solid state electrochromic devices fabricated with the reactive sputter and cathodic arc technology", AIP Advances 6, 115009 (2016) (Year: 2016).*

Field et al. "The electronic structure of tungsten oxide thin films prepared by pulsed cathode arc deposition and plasma-assisted pulsed magnetron sputtering", J. Phys. Condens. Matter 20 (2008) (Year: 2008).*

Ander et al. "High quality ZnO:Al transparent conducting oxide films synthesized by pulsed filtered cathodic arc deposition", Thin Solid Film 518 (2010) (Year: 2010).*

* cited by examiner

METHOD FOR FABRICATING ELECTROCHROMIC DEVICE

FIELD OF THE INVENTION

The present invention relates generally to a method for fabricating an electrochromic device, and particularly to a method for fabricating a solid-state electrochromic device using the vacuum cathodic arc-plasma deposition.

BACKGROUND OF THE INVENTION

Electrochromism can produce interesting phenomenon based on redox reaction that owns a reversible and persistent changing in color and optical transmittance by a small applied electric voltage pulse difference. The materials having electrochromic properties are called electrochromic materials, which can be classified into inorganic and organic materials. The inorganic materials can further include metal oxides, such as tungsten trioxide ($WO_3$) and covalent metal complex compounds, such as Prussian blue. The organic materials can further include small molecule materials, such as viologen, and polymer materials, such as phthalocyanine. For electrochromic devices made of electrochromic materials, only a small electric voltage is required to drive color changes. Compared to other active color changing technologies, the applications of electrochromic devices are more extensive. In addition, EC device can be applied to the power saving field or electronic products, include power-saving smart windows, automotive sunroofs, anti-glare rearview mirrors, e-papers, and displays.

For instance, take power-saving smart windows by adjusting the transparency of electrochromic devices, indoor temperature and luminance can be modulated accordingly. To elaborate, in summer, by applying a voltage across electrochromic devices, the devices will be colored and their transparency will be lowered. Then the radiation heat from the sunlight can be blocked from buildings and thus reducing the loading of indoor air conditioners. In winter, the electrochromic devices can be discolored to increase the transparency. Then the sunlight can illuminate building for modulating indoor temperature as well as providing natural lighting. Hence, the efficacy of environmental protection and saving power can be achieved.

Current methods for fabricating electrochromic device adopt costly magnetic plasma sputters, leading to expensive manufacturing costs. Due to electrochromic materials are mostly target materials with high melting points, the problem of target poisoning occurs and thereby the yield is inferior, which also increase the manufacturing costs using magnetic plasma sputters. Consequently, electrochromic devices are pricy and not applicable to domestic and commercial buildings. Their prevalence in the market is still low.

Besides, the electrochromic device comprises an electrolyte layer, which is a conductive layer and for facilitating electron transport. The electrochromic devices according to the prior art adopt organic gel or liquid electrolyte. Unfortunately, while situated in areas having drastic temperature changes, the endurance as well as the leakage of organic gel or liquid electrolyte is questionable. Moreover, for the application market of miniature electrochromic products such as color-changing electronic tags or smart cards capable of displaying remaining power, current fabrication technology faces bottlenecks in development.

Given the problems encountered by the electrochromic devices according to the prior art, the present invention provides a method for fabricating electrochromic device. By the improved method for fabricating, the manufacturing costs can be lower and higher deposition rate using the vacuum cathodic arc-plasma technique. In addition, for meeting the trend of miniature electrochromic products, the electrochromic devices fabricated in the method for fabricating according to the present invention are highly durable, and hence truly exhibiting industrial practicality and applicability.

SUMMARY

An objective of the present invention is to provide a method for fabricating electrochromic device. This method adopts the vacuum cathodic arc-plasma deposition to multi-layer ECD comprises five layers with an ionic conduction layer (electrolyte) in contact with an electrochromic (EC) layer and an ion storage (complementary) layer, all sandwiched between two transparent conducting layers. Thereby, the thin film structures can have more uniform crystallinity and the adhesion between the thin film structures is excellent.

Another objective of the present invention is to provide a method for fabricating electrochromic device. The arc plasma is adopted for fabricating an electrochromic device, which comprises an ion storage layer, an ion transport layer, and an electrochromic layer having a plurality of pores. Thereby, the electric capacity and the coloring efficiency of the electrochromic device are enhanced.

Still another objective of the present invention is to provide a method for fabricating electrochromic device. The arc plasma is adopted for fabricating an electrochromic device. An ion transport layer of the electrochromic device is a solid structure for preventing destruction in structure due to drastic temperature changes in the environment. Thereby, the lifetime of the electrochromic device can be extended.

A further objective of the present invention is to provide a method for fabricating electrochromic device. The arc plasma is adopted for fabricating an electrochromic device. According to the present invention, no target material with high melting points is required and the deposition rate is high. Thereby, the temperature ramp-up time can be saved and hence the process efficiency can be improved significantly. In addition, the equipment is cheaper and the range of process parameters is broader. Thereby, the method according to the present invention can be applied extensively to the processes adopting various electrochromic materials.

In order to achieve the above objectives, the present invention discloses a method for fabricating electrochromic device, which comprises steps of depositing a first transparent electrode having a plurality of island structures on a substrate using vacuum cathodic arc-plasma deposition; depositing an ion storage layer having a plurality of first pore structures on the first transparent electrode using vacuum cathodic arc-plasma deposition; depositing an ion transport layer having a plurality of second pore structures on the ion storage layer using vacuum cathodic arc-plasma deposition; injecting lithium ions or hydrogen ions into the ion storage layer via the ion transport layer using a liquid solution immersion method; depositing an electrochromic layer having a plurality of third pore structures on the ion transport layer using vacuum cathodic arc-plasma deposition; and depositing a second transparent electrode on the electrochromic layer using vacuum cathodic arc-plasma deposition.

In the above method for fabricating electrochromic device, another ion injection method can be adopted for injecting ions into the ion storage layer. The method comprises steps of: depositing a first transparent electrode having a plurality of island structures on a substrate using vacuum cathodic arc-plasma deposition; while depositing an ion storage layer on the first transparent electrode using vacuum cathodic arc-plasma deposition, adding hydrogen gas to generate hydrogen ions in the plasma reaction and enabling the ion storage layer to have a plurality of first pore structures; depositing an ion transport layer having a plurality of second pore structures on the ion storage layer using vacuum cathodic arc-plasma deposition; depositing an electrochromic layer having a plurality of third pore structures on the ion transport layer using vacuum cathodic arc-plasma deposition; and depositing a second transparent electrode on the electrochromic layer using vacuum cathodic arc-plasma deposition.

According to an embodiment of the present invention, the material of the first and second transparent electrodes is selected from the group consisting of gallium zinc oxide (GaZnO), indium tin oxide (ITO), and indium zinc tin oxide (IZTO).

According to an embodiment of the present invention, the material of the ion transport layer is tantalum pentoxide ($Ta_2O_5$).

According to an embodiment of the present invention, the material of the ion storage layer is selected from the group consisting of nickel vanadium oxide (NiVO), nickel oxide (NiO), and iridium oxide ($IrO_2$).

According to an embodiment of the present invention, the material of the electrochromic layer is selected from the group consisting of tungsten trioxide ($WO_3$), titanium dioxide ($TiO_2$), and molybdenum oxide ($MO_3$).

DETAILED DESCRIPTION

In order to make the structure and characteristics as well as the effectiveness of the present invention to be further understood and recognized, the detailed description of the present invention is provided as follows along with embodiments and accompanying figures.

The present invention provides a method for fabricating electrochromic device. The purposes of the present invention are to improve the high cost and low efficiency of the processes according to the prior art and further to enhance the electric capacity, color changing efficiency, the crystallization uniformity of thin film structures, and the adhesion between thin film structures of electrochromic devices. In the following, the method for fabricating electrochromic device will be described.

The plasma generated by using arc is called arc plasma. The arc, also named the arc discharged, is formed by applying a high-intensity electric field across a medium to induce electrical breakdown of the medium. Consequently, the resistance of an insulating medium, for example, the air, in the normal state drops rapidly and the medium becomes conductive. Taking the air for example, under stable arc discharge, the air will be deionized into a mixture consisting of positive ions, free electrons, and neutral particles. The mixture is just the plasma. The motion of the particles in plasma exhibits grouping behaviors, meaning that the motion of each particle will drive the other charged particles in the plasma and thus contributing to excellent electrical conductivity.

Thanks to the high potential and dynamic energy of the ions in the arc plasma, when ions are introduced in proper ways and bombard a target material, sputtering particles with higher uniformity can be generated and further deposited on a substrate. According to the present invention, the arc plasma is adopted to deposit materials on a substrate sequentially to form electrochromic devices. In the following, the method for fabricating electrochromic device according to the present invention will be described in detail.

Figure 1:
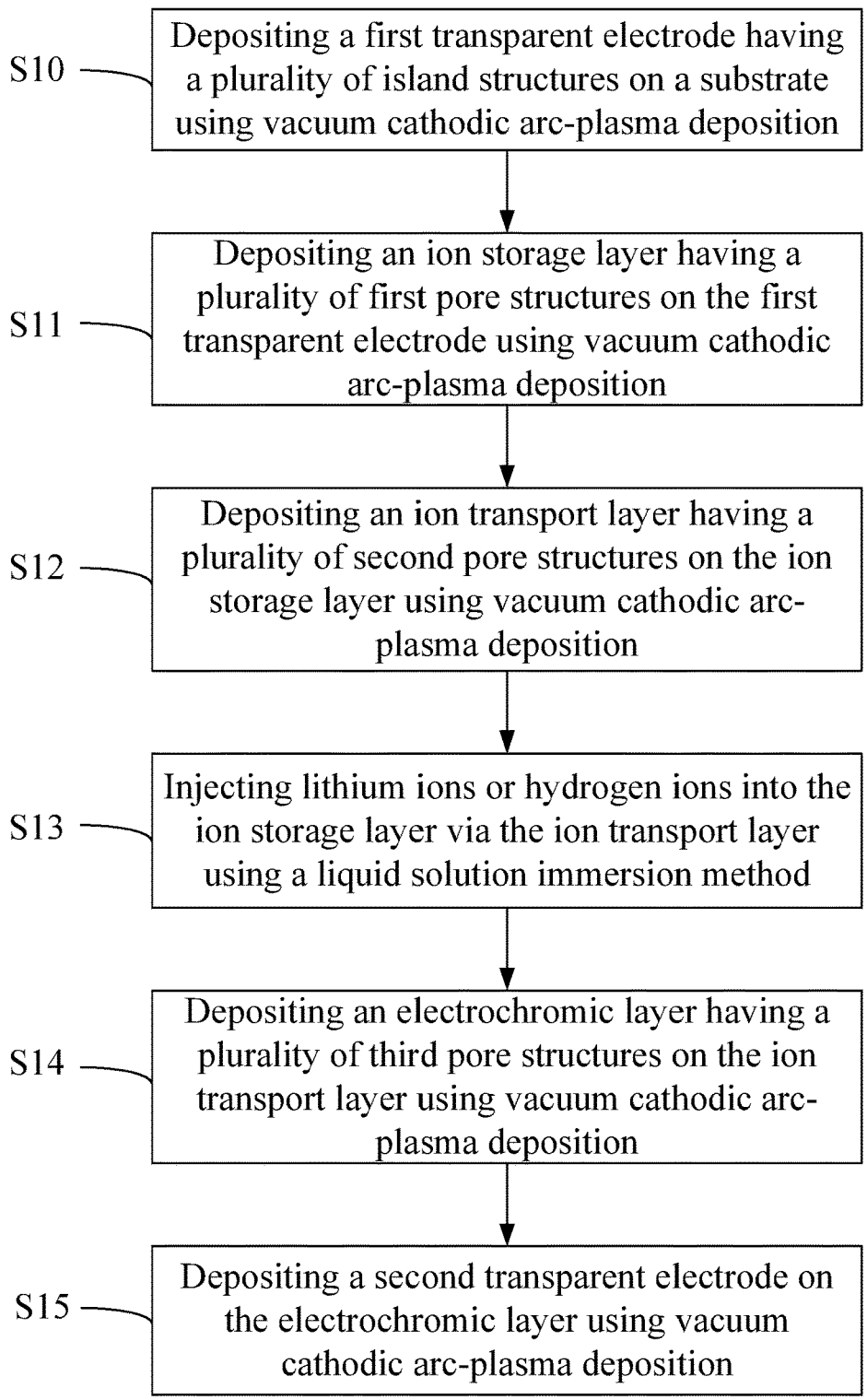
FIG. 1 shows a process flowchart according the first embodiment of the present invention.

Please refer to FIG. 1, which shows a process flowchart according the first embodiment of the present invention. As shown in the figure, the first embodiment according to the present invention comprises steps of:

Step S10: Depositing a first transparent electrode having a plurality of island structures on a substrate using vacuum cathodic arc-plasma deposition;

Step S11: Depositing an ion storage layer having a plurality of first pore structures on the first transparent electrode using vacuum cathodic arc-plasma deposition;

Step S12: Depositing an ion transport layer having a plurality of second pore structures on the ion storage layer using vacuum cathodic arc-plasma deposition;

Step S13: Injecting lithium ions or hydrogen ions into the ion storage layer via the ion transport layer using a liquid solution immersion method;

Step S14: Depositing an electrochromic layer having a plurality of third pore structures on the ion transport layer using vacuum cathodic arc-plasma deposition; and Step S15: Depositing a second transparent electrode on the electrochromic layer using vacuum cathodic arc-plasma deposition.

Before executing the step S11, the substrate is first placed in a chamber and the chamber is vacuumed to an ambient pressure below $2\times10^{-5}$ torr. Then argon and oxygen are introduced at an appropriate flow rate.

Before executing the step S13, the vacuum in the chamber is broken. The ion storage layer is activated by using the liquid solution immersion method. Next, before executing the step S14, the chamber is vacuumed again to an ambient pressure below $2\times10^{-5}$ torr. And argon and oxygen are introduced at an appropriate flow rate.

Afterwards, as depicted by the step S10 in the figure, according to the method for fabricating electrochromic device provided by the present invention, deposit a first transparent electrode having a plurality of island structures on a substrate using vacuum cathodic arc-plasma deposition. To meet the requirements of the end products of electrochromic devices, the material of the substrate is mostly transparent. According to the present embodiment, glass substrates or flexible optical plastic substrates are adopted. Nonetheless, the material of the substrate is not limited to the above materials.

The first transparent electrode is a transparent conductive layer. When the device is operating, an electric field is applied to the first transparent electrode and conducted to an ion storage layer. The material can be selected from the general electrode materials for diodes. According to the present embodiment, the material of the electrode is selected from, but not limited to, the group consisting of gallium zinc oxide (GaZnO), indium tin oxide (ITO), and indium zinc tin oxide (IZTO). In addition, to increase the surface area of the electrode for enhancing the reaction rates of the electrochromic device for bleaching and coloring, the first transparent electrode according to the present embodiment has island structures. Nonetheless, the structures and shapes are not limited to the above.

Next, as depicted by the step S11 in the figure, according to the method for fabricating electrochromic device provided by the present invention, deposit an ion storage layer on the first transparent electrode using vacuum cathodic arc-plasma deposition. The ion storage layer is used for storing the corresponding reverse ions while oxidation and reduction reactions occurring in the electrochromic device for maintain charge balance in the device. The material of the ion storage layer is selected from, but not limited to, the group consisting of nickel vanadium oxide (NiVO), nickel oxide (NiO), and iridium oxide ($IrO_2$). Besides, to increase the surface area of the ion storage layer and hence enhancing the electrical capacity as well as the coloring efficiency, the ion storage layer according to the present embodiment has nanometer porous structures. Nonetheless, the structures are not limited to the above.

Next, as depicted by the step S12 in the figure, according to the method for fabricating electrochromic device provided by the present invention, deposit an ion transport layer on the ion storage layer using vacuum cathodic arc-plasma deposition. The ion transport layer is an electrolyte layer having excellent electrical conductivity for facilitating ions flowing to the ion storage layer or an electrochromic layer. The material of the ion transport layer is, but not limited to, tantalum pentoxide ($Ta_2O_5$). Besides, to increase the surface area of the ion transport layer and hence enhancing the ion conduction efficiency, the ion transport layer according to the present embodiment has nanometer porous structures. Nonetheless, the structures are not limited to the above.

Next, as depicted by the step S13 in the figure, according to the method for fabricating electrochromic device provided by the present invention, inject lithium ions or hydrogen ions into the ion storage layer via the ion transport layer using a liquid solution immersion method. The injected ions are just the ion source when the electrochromic device is operating. By using the liquid solution immersion method to activate the ion storage layer, the performance of the structure during the process of fabricating the electrochromic device can be observed real-timely. The whether the ion storage layer can be operated to change color will be known. Accordingly, the production yield can be improved.

Next, as depicted by the step S14 in the figure, according to the method for fabricating electrochromic device provided by the present invention, deposit an electrochromic layer on the ion transport layer using vacuum cathodic arc-plasma deposition. The electrochromic layer is just the color-changing structure when the electrochromic device operates to induce oxidation and reduction reactions. The material of the electrochromic layer is selected from the group consisting of tungsten trioxide ($WO_3$), titanium dioxide ($TiO_2$), and molybdenum oxide ($MO_3$). Besides, to accelerate coloring and bleaching and thus shortening the adjusting time, the electrochromic layer according to the present embodiment has nanometer porous structures. Nonetheless, the structures are not limited to the above.

Next, as depicted by the step S15 in the figure, according to the method for fabricating electrochromic device provided by the present invention, deposit a second transparent electrode on the electrochromic layer using vacuum cathodic arc-plasma deposition. The second transparent electrode is a transparent conductive layer. When the device is operating, an electric field is applied to the second transparent electrode and conducted to the electrochromic device. The material can be selected from the general electrode materials for diodes. According to the present embodiment, the material of the first and second transparent electrodes is selected from, but not limited to, the group consisting of gallium zinc oxide (GaZnO), indium tin oxide (ITO), and indium zinc tin oxide (IZTO).

Figure 2:
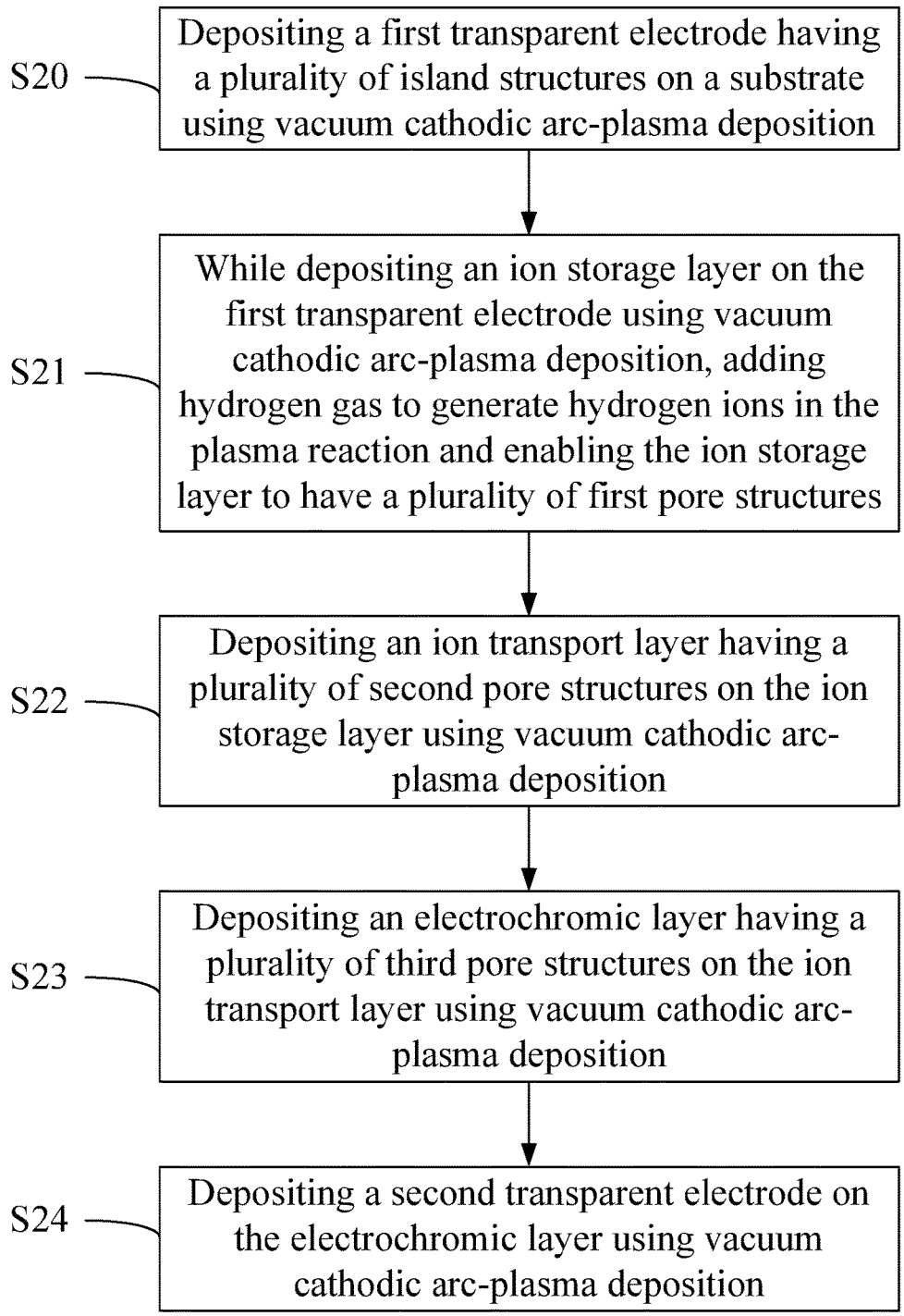
FIG. 2 shows a process flowchart according the second embodiment of the present invention.

Please refer to FIG. 2, which shows a process flowchart according the second embodiment of the present invention. As shown in the figure, the second embodiment according to the present invention comprises steps of:

Step S20: Depositing a first transparent electrode having a plurality of island structures on a substrate using vacuum cathodic arc-plasma deposition;

Step S21: While depositing an ion storage layer on the first transparent electrode using vacuum cathodic arc-plasma deposition, adding hydrogen gas to generate hydrogen ions in the plasma reaction and enabling the ion storage layer to have a plurality of first pore structures;

Step S22: Depositing an ion transport layer having a plurality of second pore structures on the ion storage layer using vacuum cathodic arc-plasma deposition;

Step S23: Depositing an electrochromic layer having a plurality of third pore structures on the ion transport layer using vacuum cathodic arc-plasma deposition; and Step S24: Depositing a second transparent electrode on the electrochromic layer using vacuum cathodic arc-plasma deposition.

The difference between the present embodiment and the first one is the method of ion injection. As depicted by the step S21 in the figure, hydrogen gas is introduced while depositing the ion storage layer on the first transparent electrode and hence giving hydrogen ions during the reaction process of arc-plasma deposition and further activating the ion storage layer. In addition, by setting the bias voltage of the arc-plasma source the ionization rate of hydrogen can be modulated. Alternatively, by setting the flow rate of hydrogen, the operating voltage can be controlled. By coordinating the two settings, the concentration of hydrogen ions can be controlled precisely, and thereby the stability and production yield of the device can be improved.

The thin film structure of the electrochromic device fabricated according to the methods as described above is a solid-state structure for preventing destruction or leakage due to drastic temperature changes in the environment. Thereby, the lifetime of the electrochromic device can be extended. In addition, the applications of the electrochromic device can be extended as well.

To sum up, the present invention discloses a method for fabricating electrochromic device by depositing materials on a substrate sequentially using arc plasma. By adopting arc plasma as the energy source, in addition to lowering equipment cost, the range of process parameters is broader. Thereby, the method according to the present invention can be applied extensively to the processes adopting various electrochromic materials. Besides, thanks to the high ionization rate using arc plasma source, the deposition efficiency can be accelerated and the deposited thin film structures can have more uniform crystallinity and the adhesion therebetween is excellent as well. Moreover, the reaction rates for coloring and bleaching of the electrochromic device fabricated according to the method of the present invention is superior. This is because the thin film structures of the device are nanometer-leveled, the impedance of the device can be reduced significantly and thus lowering the driving voltage. In summary, the method for fabricating electrochromic device according to the present invention indeed has overcome the bottlenecks of current technologies and facilitates improving the prevalence of electrochromic device in domestic buildings for saving power consumption, making the present invention a technology with high practicality.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A method for fabricating electrochromic device, comprising steps of:
   depositing a first transparent electrode having a plurality of island structures on a substrate using vacuum cathodic arc-plasma deposition;
   depositing an ion storage layer having a plurality of first pore structures on said first transparent electrode using vacuum cathodic arc-plasma deposition;
   depositing an ion transport layer having a plurality of second pore structures on said ion storage layer using vacuum cathodic arc-plasma deposition;
   injecting lithium ions or hydrogen ions into said ion storage layer via said ion transport layer using a liquid solution immersion method;
   depositing an electrochromic layer having a plurality of third pore structures on said ion transport layer using vacuum cathodic arc-plasma deposition; and
   depositing a second transparent electrode on said electrochromic layer using vacuum cathodic arc-plasma deposition.

2. The method for fabricating electrochromic device of claim 1, wherein the material of said first transparent electrode and said second transparent electrode is selected from the group consisting of gallium zinc oxide (GaZnO), indium tin oxide (ITO), and indium zinc tin oxide (IZTO).

3. The method for fabricating electrochromic device of claim 1, wherein the material of said ion storage layer is selected from the group consisting of nickel vanadium oxide (NiVO), nickel oxide (NiO), and iridium oxide ($IrO_2$).

4. The method for fabricating electrochromic device of claim 1, wherein the material of said ion transport layer is tantalum pentoxide ($Ta_2O_5$).

5. The method for fabricating electrochromic device of claim 1, wherein the material of said electrochromic layer is selected from the group consisting of tungsten trioxide ($WO_3$), titanium dioxide ($TiO_2$), and molybdenum oxide ($MO_3$).

6. A method for fabricating electrochromic device, comprising steps of:
   depositing a first transparent electrode having a plurality of island structures on a substrate using vacuum cathodic arc-plasma deposition;
   while depositing an ion storage layer on said first transparent electrode using vacuum cathodic arc-plasma deposition, adding hydrogen gas to generate hydrogen ions in the plasma reaction and enabling said ion storage layer to have a plurality of first pore structures;
   depositing an ion transport layer having a plurality of second pore structures on said ion storage layer using vacuum cathodic arc-plasma deposition;
   depositing an electrochromic layer having a plurality of third pore structures on said ion transport layer using vacuum cathodic arc-plasma deposition; and
   depositing a second transparent electrode on said electrochromic layer using vacuum cathodic arc-plasma deposition.

7. The method for fabricating electrochromic device of claim 6, wherein the material of said first transparent electrode and said second transparent electrode is selected from the group consisting of gallium zinc oxide (GaZnO), indium tin oxide (ITO), and indium zinc tin oxide (IZTO).

8. The method for fabricating electrochromic device of claim 6, wherein the material of said ion storage layer is selected from the group consisting of nickel vanadium oxide (NiVO), nickel oxide (NiO), and iridium oxide ($IrO_2$).

9. The method for fabricating electrochromic device of claim 6, wherein the material of said electrochromic layer is selected from the group consisting of tungsten trioxide ($WO_3$), titanium dioxide ($TiO_2$), and molybdenum oxide ($WO_3$).

10. The method for fabricating electrochromic device of claim 6, wherein the material of said ion transport layer is tantalum pentoxide ($Ta_2O_5$).

* * * * *